United States Patent
Satoh et al.

(10) Patent No.: US 8,493,244 B2
(45) Date of Patent: Jul. 23, 2013

(54) VECTOR QUANTIZATION DEVICE, VECTOR INVERSE-QUANTIZATION DEVICE, AND METHODS OF SAME

(75) Inventors: Kaoru Satoh, Kanagawa (JP); Toshiyuki Morii, Kanagawa (JP)

(73) Assignee: Panasonic Corporation, Osaka (JP)

( * ) Notice: Subject to any disclaimer, the term of this patent is extended or adjusted under 35 U.S.C. 154(b) by 93 days.

(21) Appl. No.: 13/148,892

(22) PCT Filed: Feb. 12, 2010

(86) PCT No.: PCT/JP2010/000881
§ 371 (c)(1),
(2), (4) Date: Aug. 10, 2011

(87) PCT Pub. No.: WO2010/092827
PCT Pub. Date: Aug. 19, 2010

(65) Prior Publication Data
US 2011/0316732 A1    Dec. 29, 2011

(30) Foreign Application Priority Data
Feb. 13, 2009   (JP) ................................ 2009-031651

(51) Int. Cl.
*H03M 7/00* (2006.01)
(52) U.S. Cl.
USPC ............... 341/50; 341/51; 341/143; 341/155; 341/200
(58) Field of Classification Search
USPC ............................ 341/143, 155, 50, 51, 200
See application file for complete search history.

(56) References Cited

U.S. PATENT DOCUMENTS

| 5,748,839 A | 5/1998 | Serizawa |
| 5,917,943 A | 6/1999 | Washizawa |
| 2003/0014249 A1* | 1/2003 | Ramo ........................... 704/230 |

(Continued)

FOREIGN PATENT DOCUMENTS

| JP | 4/351018 | 12/1992 |
| JP | 2956473 | 11/1995 |

(Continued)

OTHER PUBLICATIONS

International Search Report, dated Mar. 9, 2010.

(Continued)

*Primary Examiner* — Jean B Jeanglaude
(74) *Attorney, Agent, or Firm* — Dickinson Wright PLLC

(57) ABSTRACT

An LSP vector quantization device able to improve the precision of quantization in vector quantization where a codebook for first stage vector quantization is switched according to the type of a feature that has a correlation with the quantization target vector. In this device, a classifier (101) selects, from a plurality of code vectors for classifying, the code vector for classifying that indicates the type of the feature that has a correlation with the quantization target vector; a switch (102) selects, from among a plurality of first codebooks, the first codebook corresponding to the abovementioned type; an error minimizing unit (105) selects, from the plurality of first code vectors constituting the selected first codebook, the first code vector closest to the quantization target vector; a matrix determining unit (106) selects, from a plurality of matrices, the matrix corresponding to the abovementioned type; and the error minimizing unit (105) uses the selected matrix to select, from a plurality of second code vectors, the one that is closest to the residual vector between the selected first code vector and the quantization target vector.

7 Claims, 6 Drawing Sheets

U.S. PATENT DOCUMENTS

| | | | |
|---|---|---|---|
| 2004/0015346 A1* | 1/2004 | Yasunaga et al. | 704/219 |
| 2008/0059166 A1 | 3/2008 | Ehara | |
| 2009/0292537 A1* | 11/2009 | Ehara et al. | 704/230 |
| 2011/0004469 A1 | 1/2011 | Sato | |

FOREIGN PATENT DOCUMENTS

| | | | |
|---|---|---|---|
| JP | 8/275163 | | 10/1996 |
| JP | 9/120300 | | 5/1997 |
| JP | 3257386 | | 8/1997 |
| JP | 9/258794 | | 10/1997 |
| JP | 09311732 | * | 12/1997 |
| WO | 99/16050 | | 4/1999 |
| WO | 2006/030865 | | 3/2006 |
| WO | 2006/062202 | | 6/2006 |
| WO | 2008/047795 | | 4/2008 |

OTHER PUBLICATIONS

Gersho, et al., "Vector Quantization and Signal Compression," Kluwer International Series in Engineering and Computer Science: Communications and Information Theory, vol. 159, Chapter 12, Sections 5, 8, & 11, 1992, pp. 423-424, 434, 451-459, p. 4, lines 14-21.

Extended European Search Report dated Oct. 30, 2012.

* cited by examiner

VECTOR QUANTIZATION DEVICE, VECTOR INVERSE-QUANTIZATION DEVICE, AND METHODS OF SAME

TECHNICAL FIELD

The present invention relates to a vector quantization apparatus, vector dequantization apparatus and methods thereof that perform vector quantization on LSP (Line Spectral Pairs) parameters. More particularly, the present invention relates to a vector quantization apparatus, vector dequantization apparatus and methods thereof that perform vector quantization on LSP parameters used for a speech encoding/decoding apparatus that transmits a speech signal in the fields of a packet communication system represented by Internet communication and mobile communication system or the like.

BACKGROUND ART

In the fields of digital radio communication, packet communication represented by Internet communication or speech storage or the like, speech signal encoding/decoding techniques are indispensable for realizing effective use of transmission path capacity and storage media for radio wave or the like. Among those techniques, the speech encoding/decoding technique according to a CELP (Code Excited Linear Prediction) scheme constitutes a mainstream technique.

A CELP-based speech encoding apparatus encodes input speech based on a prestored speech model. To be more specific, the CELP-based speech encoding apparatus divides a digitized speech signal into frames of a fixed time interval on the order of 10 to 20 ms, performs linear predictive analysis on a speech signal in each frame, calculates a linear prediction coefficient (LPC) and a linear predictive residual vector and encodes the linear prediction coefficient and the linear predictive residual vector individually. As a method of encoding a linear prediction coefficient, it is a general practice to convert the linear prediction coefficient to an LSP (Line Spectral Pairs) parameter and encode the LSP parameter. Furthermore, as a method of encoding the LSP parameter, it is a frequently used practice to subject the LSP parameter to vector quantization. Vector quantization is a method whereby a code vector closest to a vector to be quantized is selected from a codebook having a plurality of representative vectors and an index (code) assigned to the selected code vector is outputted as a quantization result. In vector quantization, the codebook size is determined according to the amount of information available. When, for example, vector quantization is performed with the amount of information of 8 bits, a codebook can be configured using 256 ($=2^8$) types of code vectors.

Furthermore, to reduce the amount of information and the amount of calculation in vector quantization, various techniques are used such as Multi-stage Vector Quantization (MSVQ), Split Vector Quantization (SVQ) (e.g. see Non-Patent Literature 1). Multi-stage vector quantization is a method of vector-quantizing a vector once and further vector-quantizing a quantization error, and split vector quantization is a method of dividing a vector into a plurality of portions and quantizing the respective split vectors obtained.

Furthermore, classified vector quantization (classified VQ) is available as a technique of switching between codebooks used for vector quantization as appropriate according to phonetic characteristics (e.g. information of voicing, devoicing and mode of speech or the like) having a correlation with LSP to be quantized, thereby performing vector quantization appropriate for LSP characteristics and further improving performance of LSP encoding (e.g. see Non-Patent Literature 2). For example, using a cross correlation between a wide-band LSP (LSP obtained from a wide-band signal) and a narrow-band LSP (LSP obtained from a narrow-band signal), scalable encoding classifies the narrow-band LSP according to its characteristics, switches the first-stage codebook in multi-stage vector quantization according to the type of narrow-band LSP characteristics (hereinafter abbreviated as "type of narrow-band LSP") and vector-quantizes the wide-band LSP.

Furthermore, studies are being carried out on performing vector quantization by combining multi-stage vector quantization and classified vector quantization. In this case, the quantization performance can be improved by providing a plurality of codebook groups (first-stage codebook, second-stage codebook, . . . ) made up of a plurality of stages of multi-stage vector quantization according to the type of the narrow-band LSP, whereas a plurality of codebook groups need to be provided and a greater memory is thereby required. Thus, studies are being carried out on the possibility, when performing vector quantization by combining multi-stage vector quantization and classified vector quantization, that only the first-stage codebook may be switched according to the type of the narrow-band LSP and common codebooks from the second stage onward are used for all types of the narrow-band LSP (e.g. see Patent Literature 1). In multi-stage vector quantization, this makes it possible to prevent the memory from increasing while obtaining the effect of improving quantization performance through classified vector quantization.

CITATION LIST

Patent Literature

PTL 1
WO 2006/030865

Non-Patent Literature

NPL 1
Allen Gersho, Robert M. Gray, translated by Furui, and three others, "Vector quantization and information compression", CORONA PUBLISHING CO., LTD., Nov. 10, 1998, p. 506, 524-531

NPL 2
Allen Gersho, Robert M. Gray, translated by Furui, and three others, "Vector quantization and information compression", CORONA PUBLISHING CO., LTD. CORONA PUBLISHING CO., LTD. Nov. 10, 1998, p. 491-493

SUMMARY OF INVENTION

Technical Problem

In multi-stage vector quantization using the above described classified vector quantization, first-stage vector quantization is performed using a codebook corresponding to the type of the narrow-band LSP, and therefore the deviation of distribution of quantization errors of first-stage vector quantization differs depending on the type of the narrow-band LSP. However, since one common codebook is used irrespective of the type of the narrow-band LSP in vector quantization from the second stage onward, there is a problem that the accuracy of vector quantization from the second stage onward becomes insufficient.

FIG. 1 illustrates problems with the above described multi-stage vector quantization. In FIG. 1, black circles represent two-dimensional vectors, broken-line circles schematically represent the magnitude of variance of a vector set and the center of the circle represents an average of the vector set. Furthermore, in FIG. 1, CBa1, CBa2, . . . , CBan correspond to respective types of a narrow-band LSP and represent a plurality of codebooks used for first-stage vector quantization. CBb represents a codebook used for second-stage vector quantization.

As shown in FIG. 1, as a result of performing first-stage vector quantization using codebooks CBa1, CBa2, . . . , CBan, the deviation of distribution (distribution of black circles shown in FIG. 1) of quantization error vectors using a plurality of samples differs from one another. When second-stage vector quantization is performed on the quantization error vectors of different deviations of distribution using a common second code vector, the accuracy of second-stage quantization deteriorates.

It is therefore an object of the present invention to provide a vector quantization apparatus, vector dequantization apparatus and methods thereof in multi-stage vector quantization in which a first-stage codebook is switched according to the type of characteristics having a correlation with a vector to be quantized, capable of improving the quantization accuracy of vector quantization from a second stage onward.

Solution to Problem

A vector quantization apparatus of the present invention adopts a configuration including a first selection section that selects a classification code vector indicating a type of characteristics having a correlation with a vector to be quantized from among a plurality of classification code vectors, a second selection section that selects a first codebook corresponding to the selected classification code vector from among a plurality of first codebooks, a first quantization section that quantizes the vector to be quantized using a plurality of first code vectors making up the selected first codebook and obtains a first code, a third selection section that selects a first matrix corresponding to the selected classification code vector from among a plurality of matrices, and a second quantization section that quantizes a first residual vector which is a difference between the first code vector indicated by the first code and the vector to be quantized using a plurality of second code vectors and the selected first matrix and obtains a second code.

A vector dequantization apparatus of the present invention adopts a configuration including a receiving section that receives a first code obtained by a vector quantization apparatus quantizing a vector to be quantized and a second code obtained by further quantizing a quantization error of the quantization, a first selection section that selects a classification code vector indicating a type of characteristics having a correlation with the vector to be quantized from among a plurality of classification code vectors, a second selection section that selects a first codebook corresponding to the selected classification code vector from among a plurality of first codebooks, a first dequantization section that designates a first code vector corresponding to the first code from among a plurality of first code vectors making up the selected first codebook, a third selection section that selects a matrix corresponding to the selected classification code vector from among a plurality of matrices, and a second dequantization section that designates a second code vector corresponding to the second code from among a plurality of second code vectors and obtains a quantization vector using the designated second code vector, the selected matrix and the designated first code vector.

A vector quantization method of the present invention includes a step of selecting a classification code vector indicating a type of characteristics having a correlation with a vector to be quantized from among a plurality of classification code vectors, a step of selecting a first codebook corresponding to the selected classification code vector from among a plurality of first codebooks, a step of quantizing the vector to be quantized using a plurality of first code vectors making up the selected first codebook and obtaining a first code, a step of selecting a first matrix corresponding to the selected classification code vector from among a plurality of matrices, and a step of quantizing a first residual vector which is a difference between the first code vector indicated by the first code and the vector to be quantized using a plurality of second code vectors and the selected first matrix and obtaining a second code.

A vector dequantization method of the present invention includes a step of receiving a first code obtained by a vector quantization apparatus quantizing a vector to be quantized and a second code obtained by further quantizing a quantization error of the quantization, a step of selecting a classification code vector indicating a type of characteristics having a correlation with the vector to be quantized from among a plurality of classification code vectors, a step of selecting a first codebook corresponding to the selected classification code vector from among a plurality of first codebooks, a step of designating a first code vector corresponding to the first code from among a plurality of first code vectors making up the selected first codebook, a step of selecting a matrix corresponding to the selected classification code vector from among a plurality of matrices, and a step of designating a second code vector corresponding to the second code from among a plurality of second code vectors and obtaining a quantization vector using the designated second code vector, the selected matrix and the designated first code vector.

ADVANTAGEOUS EFFECTS OF INVENTION

According to the present invention, in multi-stage vector quantization whereby a first-stage codebook is switched according to a type of characteristics having a correlation with a vector to be quantized, vector quantization from the second stage onward is performed using a matrix corresponding to the above described type, and it is thereby possible to improve the quantization accuracy of vector quantization from the second stage onward.

DESCRIPTION OF EMBODIMENTS

Hereinafter, an embodiment of the present invention will be described in detail with reference to the accompanying drawings. A vector quantization apparatus, vector dequantization apparatus and methods thereof according to the present invention will be described by taking an LSP vector quantization apparatus, LSP vector dequantization apparatus and methods thereof as an example.

Furthermore, a case will be described in the embodiment of the present invention as an example where a wide-band LSP quantizer of scalable encoding assumes a wide-band LSP as a vector to be quantized and switches between codebooks used for first-stage quantization using a type of narrow-band LSP having a correlation with the vector to be quantized. It is also possible to switch between codebooks used for first-stage quantization using a quantized narrow-band LSP (narrow-band LSP quantized by a narrow-band LSP quantizer (not shown) beforehand) instead of the narrow-band LSP. Furthermore, it is also possible to convert the quantized narrow-band LSP into a wide-band format and switch between codebooks used for first-stage quantization using the converted quantized narrow-band LSP.

Furthermore, it is assumed that a matrix for moving a deviation of distribution of code vectors by performing matrix calculation on all code vectors making up a codebook is called "mapping matrix" in the embodiment of the present invention. The mapping matrix is actually used more often to perform matrix calculation on a vector to be quantized as in the case of the embodiment of the present invention rather than used to perform matrix calculation on a code vector.

Figure 1:
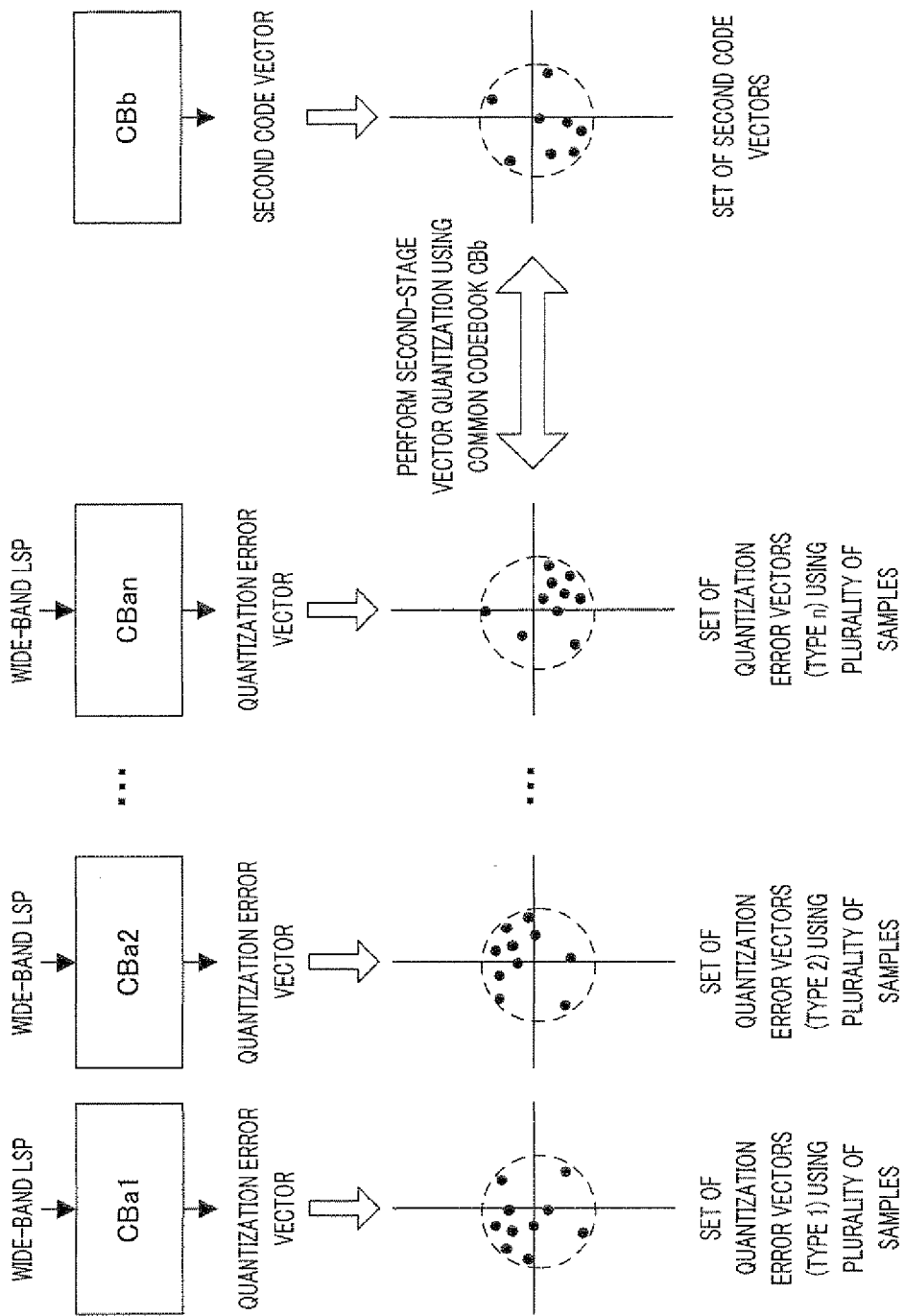
FIG. 1 illustrates problems with multi-stage vector quantization of a prior art.
Figure 2:
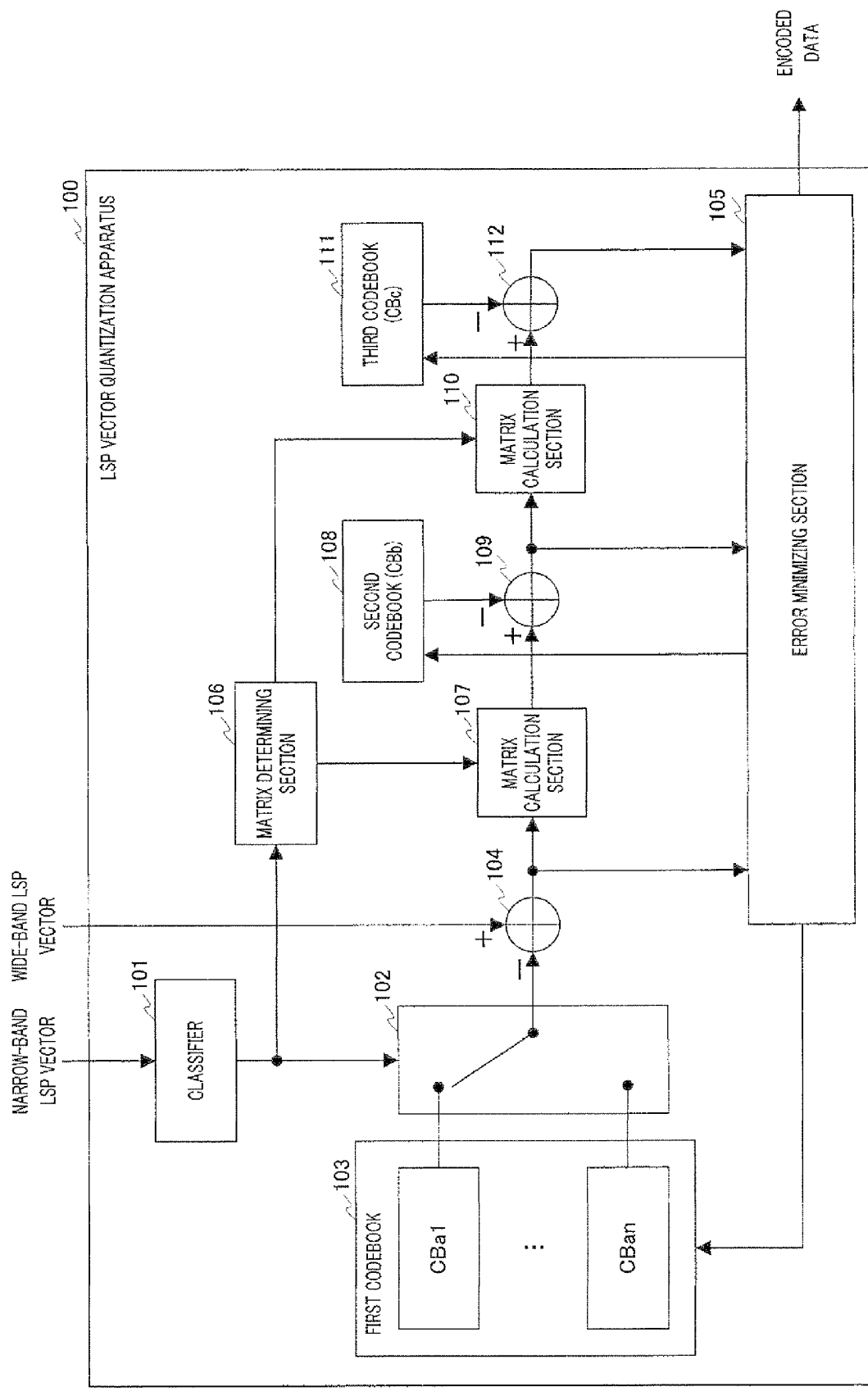
FIG. 2 is a block diagram showing the main configuration of an LSP vector quantization apparatus according to an embodiment of the present invention.

FIG. 2 is a block diagram showing the main configuration of LSP vector quantization apparatus 100 according to the embodiment of the present invention. Here, a case will be described as an example where LSP vector quantization apparatus 100 quantizes an LSP vector inputted through multistage (three-stage) vector quantization.

In FIG. 2, LSP vector quantization apparatus 100 is provided with classifier 101, switch 102, first codebook 103, adder 104, error minimizing section 105, matrix determining section 106, matrix calculation section 107, second codebook 108, adder 109, matrix calculation section 110, third codebook 111 and adder 112.

Classifier 101 stores beforehand a classification codebook made up of a plurality of pieces of classification information indicating a plurality of types of a narrow-band LSP vector. Classifier 101 selects classification information that indicates the type of a wide-band LSP vector which is a vector to be quantized from the classification codebook and outputs the classification information to switch 102, and matrix determining section 106. To be more specific, classifier 101 incorporates a classification codebook made up of code vectors (classification code vectors) corresponding to the respective types of the narrow-band LSP vector. Classifier 101 searches the classification codebook to find a code vector that minimizes the square error with respect to the inputted narrow-band LSP vector. Classifier 101 assumes an index of the code vector found through the search as classification information indicating the type of the LSP vector.

Switch 102 selects one sub-codebook corresponding to the classification information inputted from classifier 101 from first codebook 103 and connects the output terminal of the sub-codebook to adder 104.

First codebook 103 stores sub-codebooks (CBa1 to CBan) corresponding to respective types of the narrow-band LSP beforehand. That is, when, for example, the total number of types of the narrow-band LSP is n, the number of sub-codebooks making up first codebook 103 is also n. First codebook 103 outputs a first code vector indicated by error minimizing section 105 from among a plurality of first code vectors making up the sub-codebook selected by switch 102 to switch 102.

Adder 104 calculates a difference between the wide-band LSP vector inputted as the vector to be quantized and the first code vector inputted from switch 102 and outputs the difference to error minimizing section 105 as a first residual vector. Furthermore, adder 104 outputs one of the first residual vectors corresponding to all the first code vectors, which has been recognized to be a minimum through the search by error minimizing section 105 to matrix calculation section 107.

Error minimizing section 105 assumes the result of squaring the first residual vector inputted from adder 104 as a square error between the wide-band LSP vector and the first code vector, searches the first codebook and thereby obtains a first code vector that minimizes this square error. Similarly, error minimizing section 105 assumes the result of squaring the second residual vector inputted from adder 109 as a square error between the first residual vector and the second code vector, searches the second codebook and thereby obtains a second code vector that minimizes this square error. Similarly, error minimizing section 105 assumes the result of squaring the third residual vector inputted from adder 112 as a square error between the second residual vector and the third code vector, searches the third codebook and thereby obtains a third code vector that minimizes this square error. Error minimizing section 105 collectively encodes indices assigned to the three code vectors obtained through the search and outputs the encoded indices as encoded data.

Matrix determining section 106 stores a mapping matrix codebook made up of mapping matrices corresponding to different types of the narrow-band LSP vector beforehand. Here, the mapping matrix codebook is made up of two mapping matrix codebooks; a first mapping matrix codebook and a second mapping matrix codebook. Furthermore, the first mapping matrix codebook is made up of a first mapping matrix used to perform matrix calculation on the first code vector and the second mapping matrix codebook is made up of a second mapping matrix used to perform matrix calculation on the second code vector. Matrix determining section 106 selects the first mapping matrix and second mapping matrix corresponding to the classification information inputted from classifier 101 from the mapping matrix codebook. Matrix determining section 106 outputs an inverse matrix of the selected first mapping matrix to matrix calculation section 107 and outputs an inverse matrix of the selected second mapping matrix to matrix calculation section 110.

Matrix calculation section 107 performs matrix calculation on the first residual vector inputted from adder 104 using the inverse matrix of the first mapping matrix inputted from matrix determining section 106 and outputs the vector after the matrix calculation to adder 109.

Second codebook (CBb) 108 is made up of a plurality of second code vectors and outputs a second code vector indicated by an indication from error minimizing section 105 to adder 109.

Adder 109 calculates a difference between the vector after the matrix calculation inputted from matrix calculation section 107 and the second code vector inputted from second codebook 108 and outputs the difference to error minimizing section 105 as a second residual vector. Furthermore, adder 109 outputs one of the second residual vectors corresponding to all the second code vectors, which has been recognized to be a minimum through the search by error minimizing section 105 to matrix calculation section 110.

Matrix calculation section 110 performs matrix calculation on the second residual vector inputted from adder 109 using the inverse matrix of the second mapping matrix inputted from matrix determining section 106 and outputs the vector after the matrix calculation to adder 112.

Third codebook 111 (CBc) is made up of a plurality of third code vectors and outputs a third code vector indicated by an indication from error minimizing section 105 to adder 112.

Adder 112 calculates a difference between the vector after the matrix calculation inputted from matrix calculation section 110 and the third code vector inputted from third codebook 111 and outputs this difference to error minimizing section 105 as a third residual vector.

Next, operations performed by LSP vector quantization apparatus 100 will be described by taking a case where the order of the wide-band LSP vector to be quantized is an R-th order as an example. In the following description, the wide-band LSP vector will be represented as LSP(i) (i=0, 1, ..., R−1).

Classifier 101 incorporates a classification codebook made up of n code vectors (classification code vectors) corresponding to n types of narrow-band LSP vectors. Classifier 101 finds an m-th code vector in which the square error with the inputted narrow-band LSP vector becomes a minimum by searching the code vectors. Classifier 101 outputs m ($1 \leq m \leq n$) to switch 102 and matrix determining section 106 as classification information.

Switch 102 selects sub-codebook CBam corresponding to classification information m from first codebook 103 and connects the output terminal of the sub-codebook to adder 104.

First codebook 103 outputs first code vector $CODE\_1^{(d1')}$(i) (i=0, 1, ..., R−1) indicated by indication d1' from error minimizing section 105 from each first code vector $CODE\_1^{(d1)}$(i) (d1=0, 1, ..., D1−1, i=0, 1, ..., R−1) making up CBam of n sub-codebooks CBa1 to CBan to switch 102. Here, D1 is the total number of code vectors in the first codebook and d1 is an index of the first code vector. Here, first codebook 103 sequentially receives the values of d1' from d1'=0 to d1'=D1−1 indicated by error minimizing section 105.

Adder 104 calculates a difference between wide-band LSP vector LSP(i) (i=0, 1, ..., R−1) inputted as the vector to be quantized and first code vector $CODE\_1^{(d1')}$(i) (i=0, 1, ..., R−1) inputted from first codebook 103 according to equation 1 below and outputs this difference to error minimizing section 105 as first residual vector $Err\_1^{(d1')}$(i) (i=0, 1, ..., R−1). Furthermore, adder 104 outputs first residual vector $Err\_1^{(d1\_min)}$(i) (i=0, 1, ..., R−1) which has been recognized to be a minimum through the search by error minimizing section 105 of first residual vector $Err\_1^{(d1')}$(i) (i=0, 1, ..., R−1) corresponding to d1' from d1'=0 to d1'=D1−1 to matrix calculation section 107.

[1]

$$Err\_1^{(d1')}(i) = LSP(i) - CODE\_1^{(d1')}(i) \ (i=0, 1, ..., R-1) \quad \text{(Equation 1)}$$

Error minimizing section 105 sequentially indicates the values of d1' from d1'=0 to d1'=D1−1 to first codebook 103, squares first residual vector $Err\_1^{(d1')}$(i) (i=0, 1, ..., R−1) inputted from adder 104 for d1' from d1'=0 to d1'=D1−1 according to equation 2 below and finds square error Err.

(Equation 2)

$$Err = \sum_{i=0}^{R-1} \left(Err\_1^{(d1')}(i)\right)^2 \quad [2]$$

Error minimizing section 105 stores index d1' of the first code vector whose square error Err becomes a minimum as first index d1_min.

Matrix determining section 106 selects inverse matrix $MM\_1^{-1(m)}$ of the first mapping matrix corresponding to classification information in from the first mapping matrix codebook and outputs inverse matrix $MM\_1^{-1(m)}$ to matrix calculation section 107. Furthermore, matrix determining section 106 selects inverse matrix $MM\_2^{-3(m)}$ of the second mapping matrix corresponding to classification information in from the second mapping matrix codebook and outputs inverse matrix $MM\_2^{-1(m)}$ to matrix calculation section 110.

Matrix calculation section 107 performs matrix calculation on first residual vector $Err\_1^{(d1\_min)}$(i) (i=0, 1, ..., R−1) inputted from adder 104 using inverse matrix $MM\_1^{-1(m)}$ of the first mapping matrix inputted from matrix determining section 106 according to equation 3 below and outputs $Map\_Err\_1^{(d1\_min)}$(i) (i=0, 1, ..., R−1) obtained to adder 109.

(Equation 3)

$$Map\_Err\_1^{(d1\_min)}(i) = \sum_{j=0}^{R-1} (mm\_1_{ij}^{-1(m)} \times Err\_1^{(d1\_min)}(j)) \quad [3]$$

$(i = 0, 1, ..., R-1)$ $$MM\_1^{-1(m)} = \begin{bmatrix} mm\_1_{00}^{-1(m)} & mm\_1_{01}^{-1(m)} & \cdots & mm\_1_{0R-1}^{-1(m)} \\ mm\_1_{10}^{-1(m)} & mm\_1_{11}^{-1(m)} & \cdots & mm\_1_{1R-1}^{-1(m)} \\ \vdots & \vdots & \ddots & \vdots \\ mm\_1_{R-10}^{-1(m)} & mm\_1_{R-11}^{-1(m)} & \cdots & mm\_1_{R-1R-1}^{-1(m)} \end{bmatrix}$$

Second codebook 108 outputs code vector $CODE\_2^{(d2')}$(i) (i=0, 1, ..., R−1) indicated by indication d2' from error minimizing section 105 from each second code vector $CODE\_2^{(d2)}$(i) (d2=0, 1, ..., D2−1, i=0, 1, ..., R−1) making up the codebook to adder 109. Here, D2 is the total number of code vectors of the second codebook and d2 is an index of the code vector. Second codebook 108 sequentially receives the values of d2' from d2'=0 to d2'=D2−1 indicated by error minimizing section 105.

Adder 109 calculates a difference between first residual vector $Map\_Err\_1^{(d1\_min)}$(i) (i=0, 1, ..., R−1) after the matrix calculation inputted from matrix calculation section 107 and second code vector $CODE\_2^{(d2')}$(i) (i=0, 1, ..., R−1) inputted from second codebook 108 according to equation 4 below and outputs this difference to error minimizing section 105 as second residual vector $Err\_2^{(d2')}$(i) (i=0, 1, ..., R−1). Furthermore, adder 109 outputs second residual vector $Err\_2^{(d2\_min)}$(i) (i=0, 1, ..., R−1) which has been recognized to be a minimum through the search by error minimizing section 105 of second residual vector $Err\_2^{(d2')}$(i) (i=0, 1, ..., R−1) corresponding to d2' from d2'=0 to d2'=D1−1 to matrix calculation section 110.

[4]

$$\text{Err\_2}^{(d2')}(i) = \text{Map\_Err\_1}^{(d1\_min)}(i) - \text{CODE\_2}^{(d2')}(i)$$
$$(i=0, 1, \ldots, R-1) \quad \text{(Equation 4)}$$

Here, error minimizing section 105 sequentially indicates the value of d2' from d2'=0 to d2'=D2−1 to second codebook 108, squares second residual vector $\text{Err\_2}^{(d2')}(i)$ (i=0, 1, ..., R−1) inputted from adder 109 on d2' from to d2'=D2−1 according to equation 5 below and finds square error Err.

(Equation 5)

$$Err = \sum_{i=0}^{R-1} \left(\text{Err\_2}^{(d2')}(i)\right)^2 \quad [5]$$

Error minimizing section 105 stores index d2' of the second code vector whose square error Err becomes a minimum as second index d2_min.

Matrix calculation section 110 performs matrix calculation on second residual vector $\text{Err\_2}^{(d2\_min)}(i)$ (i=0, 1, ..., R−1) inputted from adder 109 using inverse matrix $\text{MM\_2}^{-1(m)}$ of the second mapping matrix inputted from matrix determining section 106 according to equation 6 below and outputs $\text{Map\_Err\_2}^{(d2\_min)}(i)$ (i=0, 1, ..., R−1) obtained to adder 112.

(Equation 6)

$$\text{Map\_Err\_2}^{(d2\_min)}(i) = \sum_{j=0}^{R-1} (\text{mm\_2}_{ij}^{-1(m)} \times \text{Err\_2}^{(d2\_min)}(j)) \quad [6]$$

$$(i = 0, 1, \ldots, R-1)$$

$$\text{MM\_2}^{-1(m)} = \begin{bmatrix} \text{mm\_2}_{00}^{-1(m)} & \text{mm\_2}_{01}^{-1(m)} & \cdots & \text{mm\_2}_{0R-1}^{-1(m)} \\ \text{mm\_2}_{10}^{-1(m)} & \text{mm\_2}_{11}^{-1(m)} & \cdots & \text{mm\_2}_{1R-1}^{-1(m)} \\ \vdots & \vdots & \ddots & \vdots \\ \text{mm\_2}_{R-10}^{-1(m)} & \text{mm\_2}_{R-11}^{-1(m)} & \cdots & \text{mm\_2}_{R-1R-1}^{-1(m)} \end{bmatrix}$$

Third codebook 111 outputs third code vector $\text{CODE\_3}^{(d3')}(i)$ (i=0, 1, ..., R−1) indicated by indication d3' from error minimizing section 105 from each third code vector $\text{CODE\_3}^{(d3)}(i)$ (d3=0, 1, ..., D3−1, i=0, 1, ..., R−1) making up the codebook to adder 112. Here, D3 is the total number of code vectors of the third codebook and d3 is an index of the code vector. Third codebook 111 sequentially receives the values of d3' from d3'=0 to d3'=D3−1 indicated by error minimizing section 105.

Adder 112 calculates a difference between second residual vector $\text{Map\_Err\_2}^{(d2\_min)}(i)$ (i=0, 1, ..., R−1) after the matrix calculation inputted from matrix calculation section 110 and code vector $\text{CODE\_3}^{(d3')}(i)$ (i=0, 1, ..., R−1) inputted from third codebook 111 according to equation 7 below and outputs this difference to error minimizing section 105 as third residual vector $\text{Err\_3}^{(d3')}(i)$ (i=0, 1, ..., R−1).

[7]

$$\text{Err\_3}^{(d3')}(i) = \text{Map\_Err\_2}^{(d2\_min)}(i) - \text{CODE\_3}^{(d3')}(i)$$
$$(i=0, 1, \ldots, R-1) \quad \text{(Equation 7)}$$

Here, error minimizing section 105 sequentially indicates the values of d3' from d3'=0 to d3'=D3−1 to third codebook 111, squares third residual vector $\text{Err\_3}^{(d3')}(i)$ (i=0, 1, ..., R−1) inputted from adder 112 for d3' from d3'=0 to d3'=D3−1 according to equation 8 below and finds square error Err.

(Equation 8)

$$Err = \sum_{i=0}^{R-1} \left(\text{Err\_3}^{(d3')}(i)\right)^2 \quad [8]$$

Next, error minimizing section 105 stores index d3' of the third code vector whose square error Err becomes a minimum as third index d3_min. Error minimizing section 105 then collectively encodes first index d1_min, second index d2_min and third index d3_min and outputs the encoded indices as encoded data.

Figure 3:
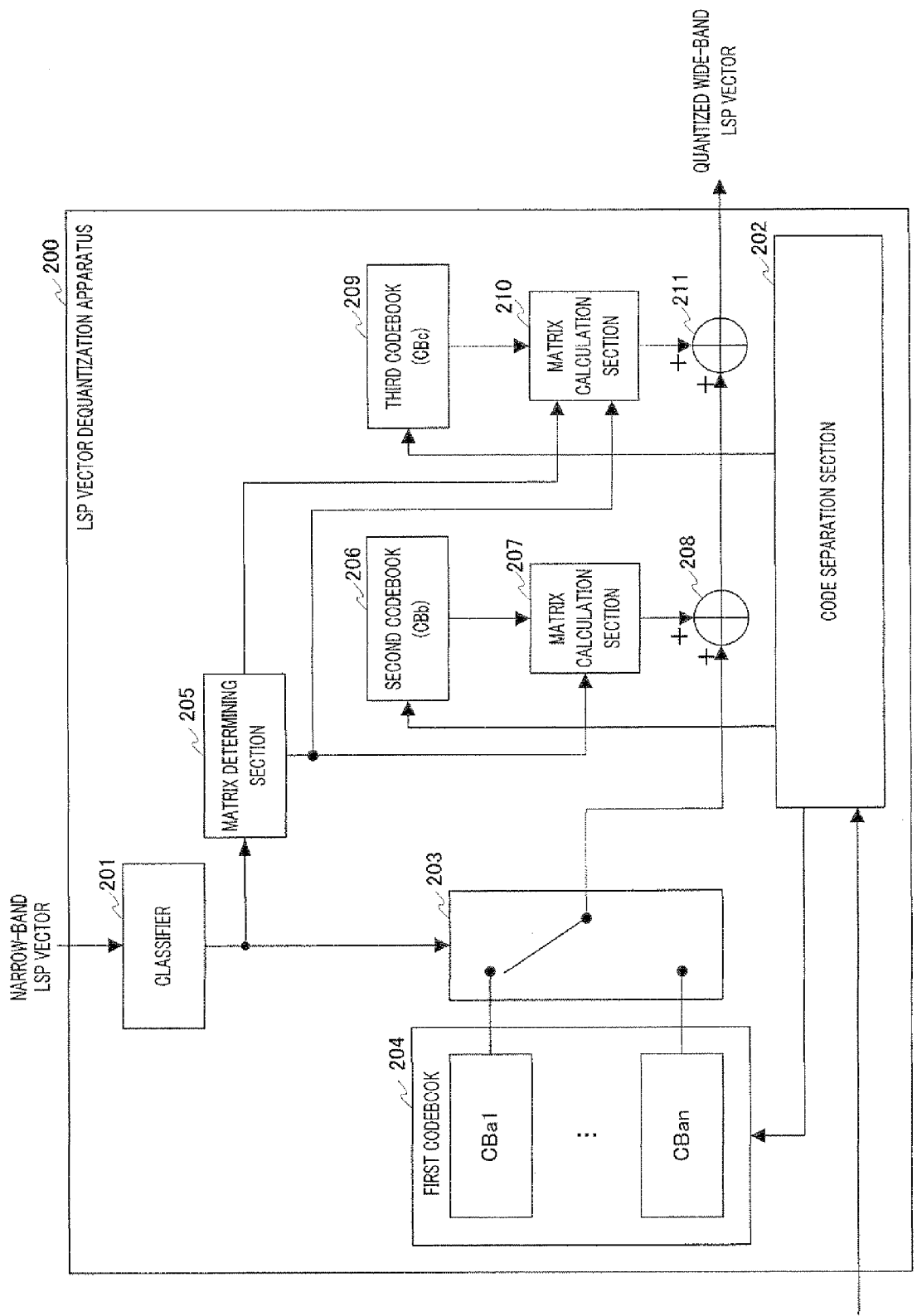
FIG. 3 is a block diagram showing the main configuration of an LSP vector dequantization apparatus according to the embodiment of the present invention.

FIG. 3 is a block diagram showing the main configuration of LSP vector dequantization apparatus 200 according to the present embodiment. LSP vector dequantization apparatus 200 decodes encoded data outputted from LSP vector quantization apparatus 100 and generates a quantized LSP vector.

LSP vector dequantization apparatus 200 is provided with classifier 201, code separation section 202, switch 203, first codebook 204, matrix determining section 205, second codebook (CBb) 206, matrix calculation section 207, adder 208, third codebook (CBc) 209, matrix calculation section 210 and adder 211. First codebook 204 is provided with a sub-codebook of the same contents as those of the sub-codebook (CBa1 to CBan) provided for first codebook 103 and matrix determining section 205 is provided with a mapping matrix codebook of the same contents as those of the mapping matrix codebook provided for matrix determining section 106. Furthermore, second codebook 206 is provided with a codebook of the same contents as those of the codebook provided for second codebook 108 and third codebook 209 is provided with a codebook of the same contents as those of the codebook provided for third codebook 111.

Classifier 201 stores a classification codebook made up of a plurality of pieces of classification information indicating a plurality of types of narrow-band LSP vectors. Classifier 201 selects classification information indicating the type of a wide-band LSP vector which is a vector to be quantized from the classification codebook and outputs the classification information to switch 203 and matrix determining section 205. To be more specific, classifier 201 incorporates a classification codebook made up of code vectors (classification code vectors) corresponding to respective types of narrow-band LSP vectors. Classifier 201 searches the classification codebook and thereby finds a code vector whose square error with respect to the quantized narrow-band LSP vector inputted from a narrow-band LSP quantizer (not shown) becomes a minimum. Classifier 201 assumes an index of the code vector found through the search as classification information indicating the type of the LSP vector.

Code separation section 202 separates encoded data transmitted from LSP vector quantization apparatus 100 into a first index, second index and third index. Code separation section 202 indicates the first index to first codebook 204, indicates the second index to second codebook 206 and indicates the third index to third codebook 209.

Switch 203 selects one sub-codebook (CBam) corresponding to the classification information inputted from classifier 201 from first codebook 204 and connects the output terminal of the sub-codebook to adder 208.

First codebook 204 outputs one first code vector corresponding to the first index indicated by code separation section 202 from among a plurality of first code vectors making up the first codebook (sub-codebook) selected by switch 203 to switch 203.

Matrix determining section 205 selects a first mapping matrix corresponding to classification information inputted from classifier 201 from the first mapping matrix codebook and outputs the selected first mapping matrix to matrix calculation section 207 and matrix calculation section 210. Furthermore, matrix determining section 205 selects a second mapping matrix corresponding to the classification information inputted from classifier 201 from the second mapping matrix codebook and outputs the selected second mapping matrix to matrix calculation section 210.

Second codebook 206 outputs one second code vector corresponding to the second index indicated by code separation section 202 to matrix calculation section 207.

Matrix calculation section 207 performs matrix calculation on the second code vector inputted from second codebook 206 using the first mapping matrix inputted from matrix determining section 205 and outputs the matrix calculation result to adder 208.

Adder 208 adds up the first code vector inputted from switch 203 and the matrix calculation result inputted from matrix calculation section 207 and outputs the addition result to adder 211.

Third codebook 209 outputs one third code vector corresponding to the third index indicated by code separation section 202 to matrix calculation section 210.

Matrix calculation section 210 performs matrix calculation on the third code vector inputted from third codebook 209 using the second mapping matrix inputted from matrix determining section 205 and outputs the matrix calculation result to adder 211.

Adder 211 adds up the addition result inputted from adder 208 and the matrix calculation result inputted from matrix calculation section 210 and outputs the addition result obtained as a quantized wide-band LSP vector.

Next, operations of LSP vector dequantization apparatus 200 will be described.

Classifier 201 incorporates a classification codebook made up of n code vectors (classification code vectors) corresponding to n types of narrow-band LSP vectors. Classifier 201 searches the code vector and thereby finds an m-th code vector whose square error with respect to the quantized narrow-band LSP vector inputted from a narrow-band LSP quantizer (not shown) becomes a minimum. Classifier 201 outputs m ($1 \leq m \leq n$) to switch 203 and matrix determining section 205 as classification information.

Code separation section 202 separates the encoded data transmitted from LSP vector quantization apparatus 100 into first index d1_min, second index d2_min and third index d3_min. Code separation section 202 indicates first index d1_min to first codebook 204, indicates second index d2_min to second codebook 206 and indicates third index d3_min to third codebook 209.

Switch 203 selects sub-codebook CBam corresponding to classification information m inputted from classifier 201 from first codebook 204 and connects the output terminal of the sub-codebook to adder 208.

First codebook 204 outputs first code vector $\text{CODE\_1}^{(d1\_min)}(i)$ (i=0, 1, ..., R−1) indicated by indication d1_min from code separation section 202 from each first code vector $\text{CODE\_1}^{(d1)}(i)$ (d1=0, 1, ..., D1−1, i=0, 1, ..., R−1) making up sub-codebook CBam to switch 203.

Matrix determining section 205 selects first mapping matrix $\text{MM\_1}^{(m)}$ corresponding to classification information m inputted from classifier 201 from the first mapping matrix codebook and outputs first mapping matrix $\text{MM\_1}^{(m)}$ to matrix calculation section 207 and matrix calculation section 210. Furthermore, matrix determining section 205 selects second mapping matrix $\text{MM\_2}^{(m)}$ corresponding to classification information m inputted from classifier 201 from the second mapping matrix codebook and outputs second mapping matrix $\text{MM\_2}^{(m)}$ to matrix calculation section 210.

Second codebook 206 outputs second code vector $\text{CODE\_2}^{(d2\_min)}(i)$ (i=0, 1, ..., R−1) indicated by indication d2_min from code separation section 202 from each second code vector $\text{CODE\_2}^{(d2)}(i)$ (d2=0, 1, ..., D2−1, i=0, 1, ..., R−1) making up the second codebook to matrix calculation section 207.

Matrix calculation section 207 performs matrix calculation on second code vector $\text{CODE\_2}^{(d2\_min)}(i)$ (i=0, 1, ..., R−1) inputted from second codebook 206 using first mapping matrix $\text{MM\_1}^{(m)}$ inputted from matrix determining section 205 according to equation 9 below and outputs matrix calculation result TMP_1(i) (i=0, 1, ..., R−1) obtained to adder 208.

(Equation 9)

$$\text{TMP\_1}(i) = \sum_{j=0}^{R-1} (\text{mm\_1}_{ij}^{(m)} \times \text{CODE\_2}^{(d2\_min)}(j)) \quad [9]$$

$$(i = 0, 1, \ldots, R-1)$$

$$\text{MM\_1}^{(m)} = \begin{bmatrix} \text{mm\_1}_{00}^{(m)} & \text{mm\_1}_{01}^{(m)} & \cdots & \text{mm\_1}_{0R-1}^{(m)} \\ \text{mm\_1}_{10}^{(m)} & \text{mm\_1}_{11}^{(m)} & \cdots & \text{mm\_1}_{1R-1}^{(m)} \\ \vdots & \vdots & \ddots & \vdots \\ \text{mm\_1}_{R-10}^{(m)} & \text{mm\_1}_{R-11}^{(m)} & \cdots & \text{mm\_1}_{R-1R-1}^{(m)} \end{bmatrix}$$

Adder 208 adds up matrix calculation result TMP_1(i) inputted from matrix calculation section 207 and first code vector $\text{CODE\_1}^{(d1\_min)}(i)$ (i=0, 1, ..., R−1) inputted from switch 203 according to equation 10 below and outputs addition result TMP_2(i) (i=0, 1, ..., R−1) obtained to adder 211. [10]

$$\text{TMP\_2}(i) = \text{TMP\_1}(i) + \text{CODE\_1}^{(d1\_min)}(i) \; (i=0, 1, \ldots, R-1) \quad \text{(Equation 10)}$$

Third codebook 209 outputs third code vector $\text{CODE\_3}^{(d3\_min)}(i)$ (i=0, 1, ..., R−1) indicated by indication d3_min from code separation section 202 from each third code vector $\text{CODE\_3}^{(d3)}(i)$ (d3=0, 1, ..., D3−1, i=0, 1, ..., R−1) making up the third codebook to matrix calculation section 210.

Matrix calculation section 210 performs matrix calculation on third code vector $\text{CODE\_3}^{(d3\_min)}(i)$ (i=0, 1, ..., R−1) inputted from third codebook 209 using first mapping matrix $\text{MM\_1}^{(m)}$ inputted from matrix determining section 205 according to equation 11 below and obtains matrix calculation result TMP_3(i) (i=0, 1, ..., R−1). Matrix calculation section 210 then performs matrix calculation on matrix calculation result TMP_3(i) (i=0, 1, ..., R−1) using second mapping matrix $\text{MM\_2}^{(m)}$ inputted from matrix determining section 205 according to equation 12 below and outputs matrix calculation result TMP_4(i) (i=0, 1, ..., R−1) obtained to adder 211.

(Equation 11)

$$\text{TMP\_3}(i) = \sum_{j=0}^{R-1} (\text{mm\_1}_{ij}^{(m)} \times \text{CODE\_3}^{(d3\_min)}(j)) \quad [11]$$

$(i = 0, 1, \ldots, R-1)$ $$MM\_1^{(m)} = \begin{bmatrix} \text{mm\_1}_{00}^{(m)} & \text{mm\_1}_{01}^{(m)} & \cdots & \text{mm\_1}_{0R-1}^{(m)} \\ \text{mm\_1}_{10}^{(m)} & \text{mm\_1}_{11}^{(m)} & \cdots & \text{mm\_1}_{1R-1}^{(m)} \\ \vdots & \vdots & \ddots & \vdots \\ \text{mm\_1}_{R-10}^{(m)} & \text{mm\_1}_{R-11}^{(m)} & \cdots & \text{mm\_1}_{R-1R-1}^{(m)} \end{bmatrix}$$

(Equation 12)

$$\text{TMP\_4}(i) = \sum_{j=0}^{R-1} (\text{mm\_2}_{ij}^{(m)} \times \text{TMP\_3}(j)) \, (i = 0, 1, \ldots, R-1) \quad [12]$$

$$MM\_2^{(m)} = \begin{bmatrix} \text{mm\_2}_{00}^{(m)} & \text{mm\_2}_{01}^{(m)} & \cdots & \text{mm\_2}_{0R-1}^{(m)} \\ \text{mm\_2}_{10}^{(m)} & \text{mm\_2}_{11}^{(m)} & \cdots & \text{mm\_2}_{1R-1}^{(m)} \\ \vdots & \vdots & \ddots & \vdots \\ \text{mm\_2}_{R-10}^{(m)} & \text{mm\_2}_{R-11}^{(m)} & \cdots & \text{mm\_2}_{R-1R-1}^{(m)} \end{bmatrix}$$

Adder 211 adds up addition result TMP_2(i) (i=0, 1, . . . , R−1) inputted from adder 208 and matrix calculation result TMP_4(i) (i=0, 1, . . . , R−1) inputted from matrix calculation section 210 according to equation 13 below and outputs vector Q_LSP(i) (i=0, 1, . . . , R−1) which becomes the addition result as a quantized wide-band LSP vector.
[13]

$$Q\_LSP(i) = TMP\_2(i) + TMP\_4(i) \, (i=0, 1, \ldots, R-1) \quad \text{(Equation 13)}$$

The first codebook, mapping matrix codebook, second codebook and third codebook used in LSP vector quantization apparatus 100 and LSP vector dequantization apparatus 200 are obtained and created through learning beforehand, and a learning method of these codebooks will be described.

To obtain the first codebook provided for first codebook 103 and first codebook 204 through learning, many, for example, V LSP vectors obtained from many pieces of speech data for learning are prepared. Next, V LSP vectors are grouped by type (n types), D1 first code vectors $\text{CODE\_1}^{(d1)}(i)$ (d1=0, 1, . . . , D1−1, i=0, 1, . . . , R−1) are obtained according to a learning algorithm such as LBG (Linde Buzo Gray) algorithm using an LSP vector that belongs to each group and each sub-codebook is generated.

To obtain the second codebook provided for second codebook 108 and second codebook 206 through learning, first-stage vector quantization is performed using the first codebook obtained according to the above described method using the V LSP vectors, and V first residual vectors $\text{Err\_1}^{(d1\_min)}(i)$ (i=0, 1, . . . , R−1) outputted from adder 104 are obtained. Next, D2 second code vectors $\text{CODE\_2}^{(d2)}(i)$ (d2=0, 1, . . . , D1−1, i=0, . . . , R−1) are obtained according to a learning algorithm such as an LBG (Linde Buzo Gray) algorithm using V first residual vectors $\text{Err\_1}^{(d1\_min)}(i)$ (i=0, 1, . . . , R−1) and a second codebook is generated.

To obtain the first mapping matrix codebook provided for matrix determining section 106 and matrix determining section 205 through learning, first-stage vector quantization is performed according to the first codebook obtained according to the above described method using the above V LSP vectors and V first residual vectors $\text{Err\_1}^{(d1\_min)}(i)$ (i=0, 1, . . . , R−1) outputted from adder 104 are obtained. Next, the V first residual vectors obtained are grouped by type (n types) and centroid (average) $C_1$ of the first residual vector set that belongs to each group is obtained.

Next, for the second codebook, centroid D1 is obtained by calculating an average of all second code vectors in the same way as for the first codebook.

By this means, centroid $C_1$ of the first codebook and centroid D1 of the second codebook are obtained for each type (n types). Matrix calculation is then performed on centroid D1 corresponding to type m, a matrix in which centroid C1 matches centroid D1 is obtained and the matrix obtained is assumed as the first mapping matrix corresponding to type m. A first mapping matrix is obtained for each type (n types), first mapping matrices of different types are assigned serial numbers, stored and a first mapping matrix codebook is thereby generated.

For example, when dimensional number R of the vector is two, first mapping matrix $MM\_1^{(d2)}$ in type m is obtained by solving the following simultaneous equations in equation 14 below.

(Equation 14)

$$\begin{aligned}
d\_1_0 &= \text{mm\_1}_{00}^{(m)} \times c\_1_0 + \text{mm\_1}_{01}^{(m)} \times c\_1_1 \\
d\_1_1 &= \text{mm\_1}_{10}^{(m)} \times c\_1_0 + \text{mm\_1}_{11}^{(m)} \times c\_1_1
\end{aligned} \quad [14]$$

$$D1 = \begin{bmatrix} d\_1_0 \\ d\_1_1 \end{bmatrix}$$

$$C1 = \begin{bmatrix} c\_1_0 \\ c\_1_1 \end{bmatrix}$$

$$MM\_1^{(m)} = \begin{bmatrix} \text{mm\_1}_{00}^{(m)} & \text{mm\_1}_{10}^{(m)} \\ \text{mm\_1}_{10}^{(m)} & \text{mm\_1}_{11}^{(m)} \end{bmatrix}$$

On the other hand, when dimensional number R of the vector is three or greater, first mapping matrix $MM\_1^{(m)}$ can thereby be generated by obtaining mapping matrices in two-dimensional units and performing matrix multiplication of the mapping matrices obtained. When, for example, dimensional number R of the vector is three, matrix TMP_1 that allows vector elements corresponding to the first order and second order to be mapped is obtained by solving simultaneous equations in equation 15 below.

(Equation 15)

$$\begin{aligned}
d\_1_0 &= \text{tmp\_1}_{00}^{(m)} \times c\_1_0 + \text{tmp\_1}_{01}^{(m)} \times c\_1_1 \\
d\_1_1 &= \text{tmp\_1}_{10}^{(m)} \times c\_1_0 + \text{tmp\_1}_{11}^{(m)} \times c\_1_1
\end{aligned} \quad [15]$$

$$D1 = \begin{bmatrix} d\_1_0 \\ d\_1_1 \\ d\_1_2 \end{bmatrix}$$

$$C1 = \begin{bmatrix} c\_1_0 \\ c\_1_1 \\ c\_1_2 \end{bmatrix}$$

$$TMP\_1 = \begin{bmatrix} \text{tmp\_1}_{00}^{(m)} & \text{tmp\_1}_{01}^{(m)} & 0 \\ \text{tmp\_1}_{10}^{(m)} & \text{tmp\_1}_{11}^{(m)} & 0 \\ 0 & 0 & 0 \end{bmatrix}$$

Next, matrix TMP_2 that allows vector elements corresponding to the second order and third order to be mapped is obtained by solving simultaneous equations in equation 16 below.

(Equation 16)

$$d\_1_1 = tmp\_2_{11}^{(m)} \times c\_1_1 + tmp\_2_{12}^{(m)} \times c\_1_2$$
$$d\_1_2 = tmp\_2_{21}^{(m)} \times c\_1_1 + tmp\_2_{22}^{(m)} \times c\_1_2$$

$$D1 = \begin{bmatrix} d\_1_0 \\ d\_1_1 \\ d\_1_2 \end{bmatrix}$$

$$C1 = \begin{bmatrix} c\_1_0 \\ c\_1_1 \\ c\_1_2 \end{bmatrix}$$

$$TMP\_2 = \begin{bmatrix} 0 & 0 & 0 \\ 0 & tmp\_2_{11}^{(m)} & tmp\_2_{12}^{(m)} \\ 0 & tmp\_2_{21}^{(m)} & tmp\_2_{22}^{(m)} \end{bmatrix}$$

[16]

BY performing matrix multiplication of matrix TMP_1 by matrix TMP_2 according to equation 17 below, first mapping matrix MM_1$^{(m)}$ is generated.

(Equation 17)

$$MM\_1^{(m)} = \begin{bmatrix} tmp\_1_{00}^{(m)} & tmp\_1_{01}^{(m)} & 0 \\ tmp\_1_{10}^{(m)} & tmp\_1_{11}^{(m)} & 0 \\ 0 & 0 & 0 \end{bmatrix} \begin{bmatrix} 0 & 0 & 0 \\ 0 & tmp\_2_{11}^{(m)} & tmp\_2_{12}^{(m)} \\ 0 & tmp\_2_{21}^{(m)} & tmp\_2_{22}^{(m)} \end{bmatrix}$$

[17]

Thus, when dimensional number R of the vector is three or greater, a mapping matrix is calculated by calculating matrices in two-dimensional units and finally performing matrix multiplication of all matrices.

To obtain the third codebook provided for third codebook 111 and third codebook 209 through learning, first-stage vector quantization is performed using the above described V LSP vectors and based on the first codebook obtained according to the above described method. Next, V first residual vectors Map_Err_1$^{(d1\_min)}$(i) (i=0, 1, ..., R-1) after the first mapping matrix calculation are obtained using the first mapping matrix codebook obtained according to the above described method. Next, second-stage vector quantization is performed based on the second codebook obtained according to the above described method and V second residual vectors Err_2$^{(d2\_min)}$(i) (i=0, 1, ..., R-1) outputted from adder 109 are obtained. Next, using V second residual vectors Err_2$^{(d2\_min)}$(i) (i=0, 1, ..., R-1), D3 third code vectors CODE_3$^{(d3)}$(i) (d3=0, 1, ..., D1-1, i=0, 1, ..., R-1) are obtained according to a learning algorithm such as LBG (Linde Buzo Gray) algorithm and a third codebook is generated.

To obtain the second mapping matrix codebook provided for matrix determining section 106 and matrix determining section 205 through learning, first-stage vector quantization is performed using the above described V LSP vectors and based on the first codebook obtained according to the above described method, matrix calculation is performed using the first mapping matrix obtained according to the above described method, second-stage vector quantization is performed based on the second codebook obtained according to the above described method and V second residual vectors Err_2$^{(d2\_min)}$(i) (i=0, 1, ..., R-1) outputted from adder 109 are obtained. Next, the V second residual vectors obtained are grouped by type (n types) and centroid $C_2$ of the second residual vector set that belongs to each group is obtained.

Next, centroid D2 is obtained by calculating an average of all third code vectors for the third codebook as well.

Centroid $C_2$ and centroid D2 of the third codebook are calculated for each type (n types). Matrix calculation is performed on centroid D2 corresponding to type m, a matrix in which centroid $C_2$ matches centroid D2 is calculated and the matrix obtained is assumed as a second mapping matrix corresponding to type m. A second mapping matrix is obtained for each type (n types), second mapping matrices of the respective types are assigned serial numbers and stored, and a second mapping matrix codebook is thereby generated.

In the method of obtaining above described first mapping matrix MM_1$^{(m)}$, second mapping matrix MM_2$^{(m)}$ can be obtained by replacing centroid $C_1$ by centroid $C_2$, replacing centroid D1 by centroid D2 and then repeating a similar procedure.

These learning methods are examples and each codebook may be generated using methods other than those described above.

Thus, the present embodiment switches between codebooks of first-stage vector quantization according to the type of a narrow-band LSP vector having a correlation with a wide-band LSP vector, and in multi-stage vector quantization in which the deviation of statistical distribution of a first-stage vector quantization error (first residual vector) differs from one type to another, performs matrix calculation on the first residual vector using a first mapping matrix corresponding to a classification result of a narrow-band LSP vector. This allows the deviation of distribution of second-stage code vectors to adapt to the deviation of statistical distribution of the first-stage vector quantization error, and can thereby improve the quantization accuracy of the wide-band LSP vector. Furthermore, matrix calculation is performed on the second residual vector using the second mapping matrix corresponding to the classification result of the narrow-band LSP vector. This allows the deviation of distribution of third-stage code vectors to adapt to the deviation of distribution of the second-stage vector quantization error, and can thereby improve the quantization accuracy of the wide-band LSP vector.

Figure 4:
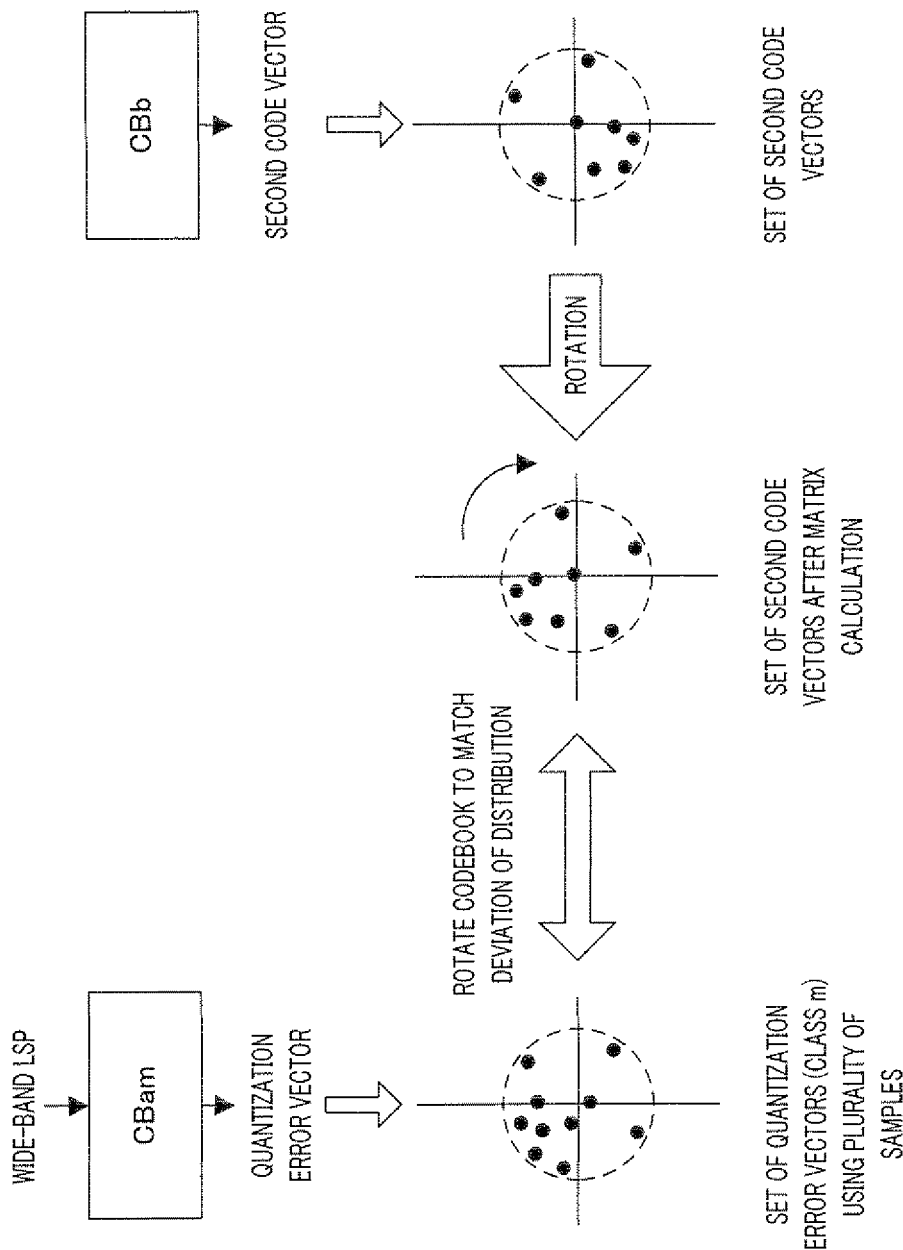
FIG. 4 is a diagram schematically illustrating an effect of LSP vector quantization according to the embodiment of the present invention.

FIG. 4 is a diagram schematically illustrating effects of LSP vector quantization according to the present embodiment. In FIG. 4, an arrow marked "rotation" represents processing of performing matrix calculation using a mapping matrix for a set of second code vectors. As shown in FIG. 4, for a quantization error vector obtained by performing vector quantization using first codebook CBam (m<=n) corresponding to the type of a narrow-band LSP, the present embodiment performs matrix calculation using a mapping matrix corresponding to this type. This allows the deviation of distribution of a set of quantization error vectors after matrix calculation to match the deviation of distribution of a set of second code vectors making up a common second codebook CBb used for second-stage vector quantization. Therefore, it is possible to improve the quantization accuracy of second-stage vector quantization.

A case has been described in the present embodiment as an example where a statistical deviation of distribution of a first-stage vector quantization error is changed according to the deviation of distribution of second-stage code vectors and the statistical deviation of distribution of the second-stage vector quantization error is changed according to the deviation of distribution of third-stage code vectors. However, the present invention is not limited to this, and it is also possible to change the deviation of distribution of code vectors used for the second-stage vector quantization according to the statistical deviation of distribution of the first-stage vector quantization error and change the deviation of distribution of code vectors used for the third-stage vector quantization according to the statistical deviation of distribution of the second-stage vector quantization error. This also makes it possible to obtain an effect of improving the quantization accuracy of the wide-band LSP vector as in the case of the present embodiment.

A case has been described in the present embodiment as an example where the mapping matrix making up the mapping matrix codebook provided for matrix determining section 106 and matrix determining section 205 supports types of the narrow-band LSP vector. However, the present invention is not limited to this, and the mapping matrix making up a mapping matrix codebook provided for matrix determining section 106 and matrix determining section 205 may also support various types into which speech characteristics are classified. In such a case, classifier 101 receives not a narrow-band LSP vector but parameters indicating characteristics of the speech as speech characteristic information as input and outputs the type of the speech characteristics corresponding to the speech characteristic information inputted to switch 102 and matrix determining section 106 as classification information. When, for example, the present invention is applied to an encoding apparatus that switches the encoder type according to characteristics such as voicing and noise characteristics of speech as in the case of VMR-WB (Variable-Rate Multimode Wideband Speech Codec), information of the encoder type may be used as the amount of speech characteristics as is.

Furthermore, although a case has been described in the present embodiment as an example where three-stage vector quantization is performed on an LSP vector, the present invention is not limited to this, but is also applicable to a case where two-stage vector quantization or vector quantization in four or more stages is performed.

Furthermore, although a case has been described in the present embodiment as an example where three-stage vector quantization is performed on an LSP vector, the present invention is not limited to this, but is also applicable to a case where vector quantization is performed together with split vector quantization.

Furthermore, although a case has been described in the present embodiment by taking a wide-band LSP vector as an example of quantization target, but the quantization target is not limited to this and vectors other than the wide-band LSP vector may also be used.

Furthermore, a case has been described in the present embodiment as an example where the deviation of distribution of code vectors is moved by performing matrix calculation using a mapping matrix. However, the present invention is not limited to this, and the deviation of distribution of code vectors may be moved by performing matrix calculation using a rotation matrix.

Furthermore, in the present embodiment, LSP vector dequantization apparatus 200 decodes encoded data outputted from LSP vector quantization apparatus 100. However, the present invention is not limited to this, but it goes without saying that LSP vector dequantization apparatus 200 can receive and decode any encoded data as long as the data is in a format the LSP vector dequantization apparatus can decode.

Furthermore, a case has been described in the present embodiment as an example where LSP vector quantization apparatus 100 and LSP vector dequantization apparatus 200 perform matrix calculation on an R-dimensional vector using a mapping matrix of R×R. However, the present invention is not limited to this, and LSP vector quantization apparatus 100 and LSP vector dequantization apparatus 200 may provide, for example, a plurality of mapping matrices of 2×2 and perform matrix calculation on vector elements for every two dimensions of an R-dimensional vector using the plurality of mapping matrices of 2×2. According to this configuration, it is possible to reduce memory necessary to store the mapping matrices and further reduce the amount of calculation required for matrix calculation.

When, for example, the vector is six-dimensional and matrix calculation is performed using three 2×2 mapping matrices (MMA_1$^{(m)}$, MMB_1$^{(m)}$ and MMC_1$^{(m)}$, equation 3 above is expressed by equation 18 below and equation 8 above is expressed by equation 19 below.

(Equation 18)

$$\text{Map\_Err\_1}^{(d1\_min)}(i) = \sum_{j=0}^{1} (\text{mma\_1}_{ij}^{-1(m)} \times \text{Err\_1}^{(d1\_min)}(j)) \ (i = 0, 1) \quad [18]$$

$$\text{Map\_Err\_1}^{(d1\_min)}(i) = \sum_{j=2}^{3} (\text{mmb\_1}_{i-2,j-2}^{-1(m)} \times \text{Err\_1}^{(d1\_min)}(j)) \ (i = 2, 3)$$

$$\text{Map\_Err\_1}^{(d1\_min)}(i) = \sum_{j=4}^{5} (\text{mmc\_1}_{i-4,j-4}^{-1(m)} \times \text{Err\_1}^{(d1\_min)}(j)) \ (i = 4, 5)$$

$$\text{MMA\_1}^{-1(m)} = \begin{bmatrix} \text{mma\_1}_{00}^{-1(m)} & \text{mma\_1}_{01}^{-1(m)} \\ \text{mma\_1}_{10}^{-1(m)} & \text{mma\_1}_{11}^{-1(m)} \end{bmatrix}$$

$$\text{MMB\_1}^{-1(m)} = \begin{bmatrix} \text{mmb\_1}_{00}^{-1(m)} & \text{mmb\_1}_{01}^{-1(m)} \\ \text{mmb\_1}_{10}^{-1(m)} & \text{mmb\_1}_{11}^{-1(m)} \end{bmatrix}$$

$$\text{MMC\_1}^{-1(m)} = \begin{bmatrix} \text{mmc\_1}_{00}^{-1(m)} & \text{mmc\_1}_{01}^{-1(m)} \\ \text{mmc\_1}_{10}^{-1(m)} & \text{mmc\_1}_{11}^{-1(m)} \end{bmatrix}$$

(Equation 19)

$$\text{TMP\_1}^{(d1\_min)}(i) = \sum_{j=0}^{1} (\text{mma\_1}_{ij}^{(m)} \times \text{CODE\_2}^{(d2\_min)}(j)) \ (i = 0, 1) \quad [19]$$

$$\text{TMP\_1}^{(d1\_min)}(i) = \sum_{j=2}^{3} (\text{mmb\_1}_{i-2,j-2}^{(m)} \times \text{CODE\_2}^{(d2\_min)}(j)) \ (i = 2, 3)$$

$$\text{TMP\_1}^{(d1\_min)}(i) = \sum_{j=4}^{5} (\text{mmc\_1}_{i-4,j-4}^{(m)} \times \text{CODE\_2}^{(d2\_min)}(j)) \ (i = 4, 5)$$

$$\text{MMA\_1}^{(m)} = \begin{bmatrix} \text{mma\_1}_{00}^{(m)} & \text{mma\_1}_{01}^{(m)} \\ \text{mma\_1}_{10}^{(m)} & \text{mma\_1}_{11}^{(m)} \end{bmatrix}$$

$$\text{MMB\_1}^{(m)} = \begin{bmatrix} \text{mmb\_1}_{00}^{(m)} & \text{mmb\_1}_{01}^{(m)} \\ \text{mmb\_1}_{10}^{(m)} & \text{mmb\_1}_{11}^{(m)} \end{bmatrix}$$

$$\text{MMC\_1}^{(m)} = \begin{bmatrix} \text{mmc\_1}_{00}^{(m)} & \text{mmc\_1}_{01}^{(m)} \\ \text{mmc\_1}_{10}^{(m)} & \text{mmc\_1}_{11}^{(m)} \end{bmatrix}$$

Here, to obtain the mapping matrices (MMA_1$^{(m)}$, MMB_1$^{(m)}$ and MMC_1$^{(m)}$) through learning, the learning method (equation 14 above) when aforementioned dimensional number R of the vector is two may be applied to vector elements for every two dimensions.

Furthermore, the vector quantization apparatus and vector dequantization apparatus according to the present embodiment can be used for a CELP encoding apparatus/CELP decoding apparatus that encodes/decodes a speech signal, music signal or the like. The CELP encoding apparatus receives an LSP converted from a linear prediction coefficient obtained by applying a linear predictive analysis to an input signal as input, performs quantization processing on the LSP and outputs the quantized LSP to a synthesis filter. When, for example, LSP vector quantization apparatus 100 according to the present embodiment is applied to a CELP type speech encoding apparatus, LSP vector quantization apparatus 100 according to the present embodiment is disposed at the LSP quantization section that outputs a quantized LSP code indicating a quantized LSP as encoded data. This makes it possible to improve vector quantization accuracy and also improve speech quality during decoding. On the other hand, the CELP decoding apparatus separates received multiplexed encoded data and decodes quantized LSP from the quantized LSP code obtained. When LSP vector dequantization apparatus 200 according to the present invention is applied to a CELP type speech decoding apparatus, LSP vector dequantization apparatus 200 according to the present embodiment may be disposed at the LSP dequantization section that outputs the decoded quantized LSP to the synthesis filter and effects similar to those described above can be obtained. Hereinafter, CELP encoding apparatus 400 and CELP decoding apparatus 450 provided with LSP vector quantization apparatus 100 and LSP vector dequantization apparatus 200 according to the present embodiment will be described using FIG. 5 and FIG. 6.

Figure 5:
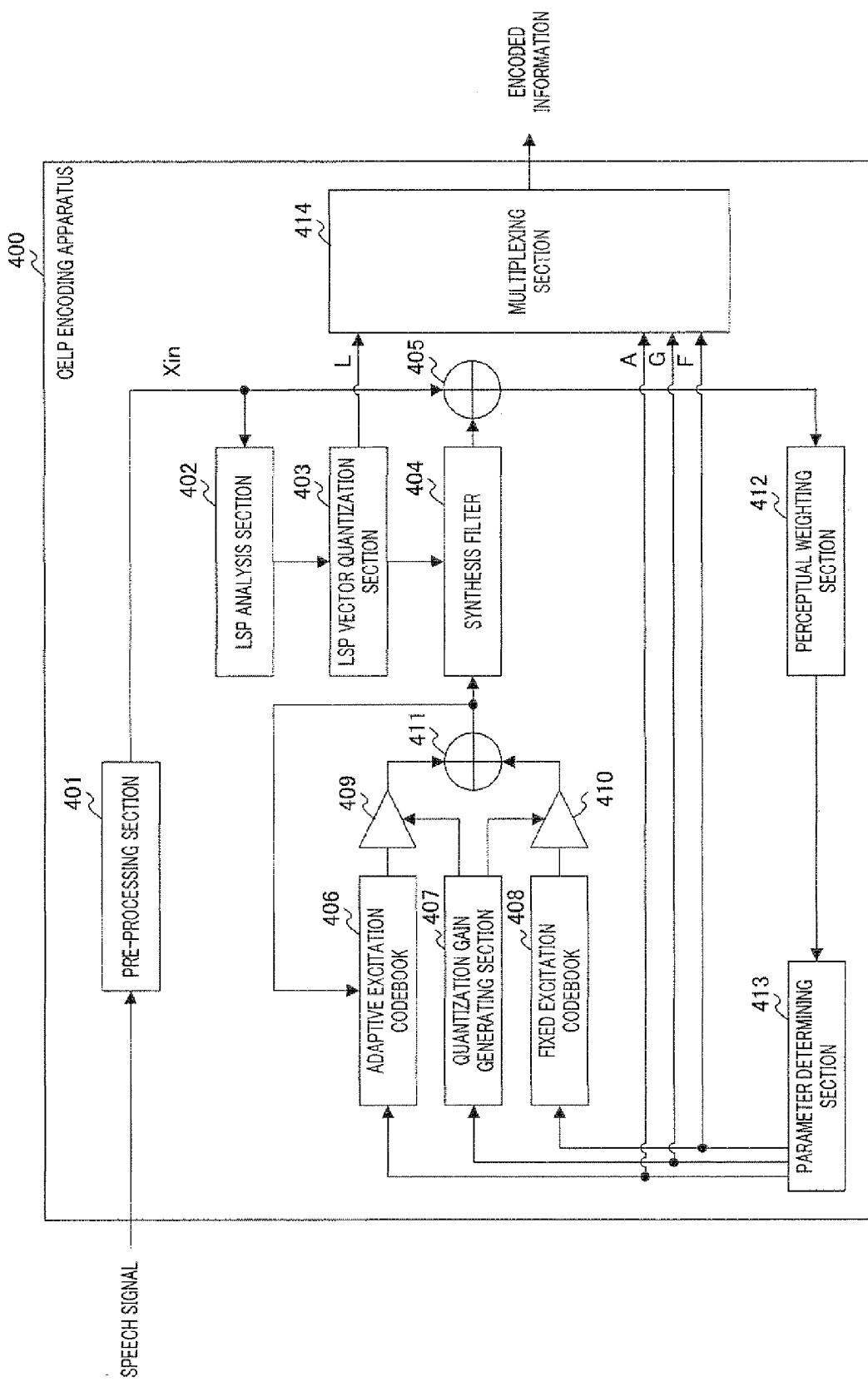
FIG. 5 is a block diagram showing the main configuration of a CELP encoding apparatus provided with the LSP vector quantization apparatus according to the embodiment of the present invention.

FIG. 5 is a block diagram showing the main configuration of CELP encoding apparatus 400 provided with LSP vector quantization apparatus 100 according to the present embodiment. CELP encoding apparatus 400 divides an inputted speech/music signal into groups of a plurality of samples and performs encoding in frame units, assuming a plurality of samples as one frame.

Pre-processing section 401 performs bypass filtering processing of removing a DC component from an inputted speech signal or music signal and also performs waveform shaping processing or pre-emphasis processing for improving the performance of subsequent encoding processing. Pre-processing section 401 then outputs signal Xin obtained through the processing to LSP analysis section 402 and adder 405.

LSP analysis section 402 performs a linear predictive analysis using signal Xin inputted from pre-processing section 401, converts the LPC obtained to an LSP vector and outputs the LSP vector to LSP vector quantization section 403.

LSP vector quantization section 403 performs quantization on the LSP vector inputted from LSP analysis section 402. LSP vector quantization section 403 outputs the quantized LSP vector obtained to synthesis filter 404 as a filter coefficient and outputs a quantized LSP code (L) to multiplexing section 414. Here, LSP vector quantization apparatus 100 according to the present embodiment is used as LSP vector quantization section 403. That is, the specific configuration and operation of LSP vector quantization section 403 are the same as those of LSP vector quantization apparatus 100. In this case, the wide-band LSP vector inputted to LSP vector quantization apparatus 100 corresponds to the LSP vector inputted to LSP vector quantization section 403. Furthermore, the encoded data outputted from LSP vector quantization apparatus 100 corresponds to the quantized LSP code (L) outputted from LSP vector quantization section 403. The filter coefficient inputted to synthesis filter 404 is a quantized LSP vector obtained by performing dequantization using the quantized LSP code (L) in LSP vector quantization section 403. The narrow-band LSP vector inputted to LSP vector quantization apparatus 100 is inputted, for example, from the outside of CELP encoding apparatus 400. When, for example, LSP vector quantization apparatus 100 is applied to a scalable encoding apparatus (not shown) having the wide-band CELP encoding section (corresponding to CELP encoding apparatus 400) and narrow-band CELP encoding section, the narrow-band LSP vector outputted from the narrow-band CELP encoding section is inputted to LSP vector quantization apparatus 100.

Synthesis filter 404 performs synthesis processing on an excitation vector inputted from adder 411, which will be described later, using a filter coefficient based on the quantized LSP vector inputted from LSP vector quantization section 403 and outputs the synthesis signal generated to adder 405.

Adder 405 inverts the polarity of the synthesis signal inputted from synthesis filter 404, adds the synthesis signal to signal Xin inputted from pre-processing section 401, thereby calculates an error signal and outputs the error signal to perceptual weighting section 412.

Adaptive excitation codebook 406 stores the excitation vector inputted from adder 411 in the past in a buffer, extracts samples corresponding to one frame from an extraction position identified by adaptive excitation lag code (A) inputted from parameter determining section 413 from the buffer and outputs the samples to multiplier 409 as an adaptive excitation vector. Here, adaptive excitation codebook 406 updates contents of the buffer every time an excitation vector is inputted from adder 411.

Quantization gain generating section 407 determines a quantization adaptive excitation gain and a quantization fixed excitation gain according to the quantization excitation gain code (G) inputted from parameter determining section 413 and outputs the gains to multiplier 409 and multiplier 410 respectively.

Fixed excitation codebook 408 outputs a vector having a shape identified by a fixed excitation vector code (F) inputted from parameter determining section 413 to multiplier 410 as a fixed excitation vector.

Multiplier 409 multiplies the adaptive excitation vector inputted from adaptive excitation codebook 406 by the quantization adaptive excitation gain inputted from quantization gain generating section 407 and outputs the multiplication result to adder 411.

Multiplier 410 multiplies the fixed excitation vector inputted from fixed excitation codebook 408 by the quantization fixed excitation gain inputted from quantization gain generating section 407 and outputs the multiplication result to adder 411.

Adder 411 adds up the adaptive excitation vector after the gain multiplication inputted from multiplier 409 and the fixed excitation vector after the gain multiplication inputted from multiplier 410 and outputs the addition result to synthesis filter 404 and adaptive excitation codebook 406 as an excitation vector. Here, the excitation vector inputted to adaptive excitation codebook 406 is stored in the buffer of adaptive excitation codebook 406.

Perceptual weighting section 412 performs perceptual weighting processing on the error signal inputted from adder 405 and outputs the error signal to parameter determining section 413 as encoding distortion.

Parameter determining section 413 selects an adaptive excitation lag that minimizes the encoding distortion inputted from perceptual weighting section 412 from adaptive excitation codebook 406 and outputs an adaptive excitation lag code (A) indicating the selection result to adaptive excitation codebook 406 and multiplexing section 414. Here, the adaptive excitation lag is a parameter indicating the position at which the adaptive excitation vector is extracted. Furthermore, parameter determining section 413 selects a fixed excitation vector that minimizes the encoding distortion outputted from perceptual weighting section 412 from fixed excitation codebook 408 and outputs a fixed excitation vector code (F) indicating the selection result to fixed excitation codebook 408 and multiplexing section 414. Furthermore, parameter determining section 413 selects a quantization adaptive excitation gain and a quantization fixed excitation gain that minimize the encoding distortion outputted from perceptual weighting section 412 from quantization gain generating section 407 and outputs a quantized excitation gain code (G) indicating the selection result to quantization gain generating section 407 and multiplexing section 414.

Multiplexing section 414 multiplexes the quantized LSP code (L) inputted from LSP vector quantization section 403, adaptive excitation lag code (A) inputted from parameter determining section 413, fixed excitation vector code (F) and quantized excitation gain code (G), and outputs encoded information.

Figure 6:
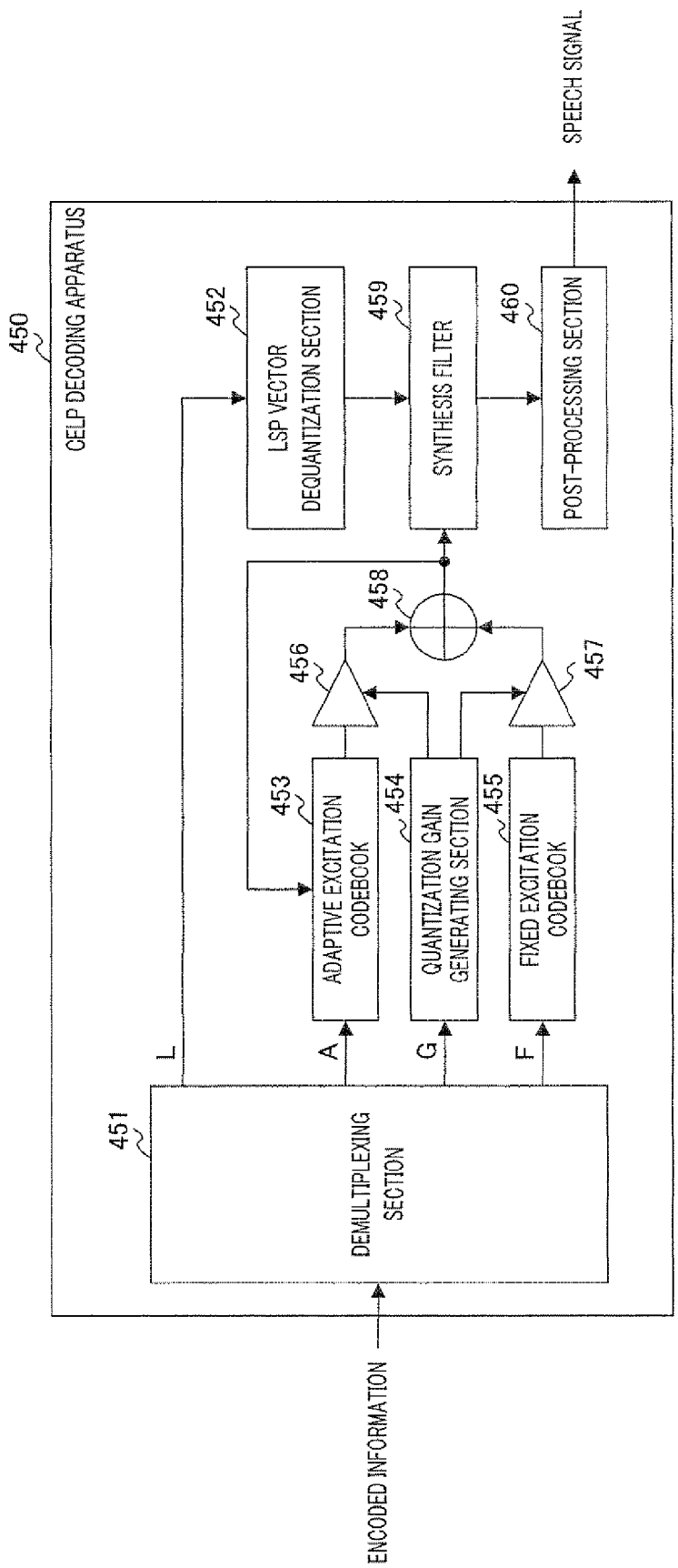
FIG. 6 is a block diagram showing the main configuration of a CELP decoding apparatus provided with the LSP vector dequantization apparatus according to the embodiment of the present invention.

FIG. 6 is a block diagram showing the main configuration of CELP decoding apparatus 450 provided with LSP vector dequantization apparatus 200 according to the present embodiment.

In FIG. 6, demultiplexing section 451 performs demultiplexing processing on the encoded information transmitted from CELP encoding apparatus 400 and obtains the quantized LSP code (L), adaptive excitation lag code (A), quantized excitation gain code (G) and fixed excitation vector code (F). Demultiplexing section 451 outputs the quantized LSP code (L) to LSP vector dequantization section 452, outputs the adaptive excitation lag code (A) to adaptive excitation codebook 453, outputs the quantized excitation gain code (G) to quantization gain generating section 454 and outputs the fixed excitation vector code (F) to fixed excitation codebook 455.

LSP vector dequantization section 452 decodes a quantized LSP vector from the quantized LSP code (L) inputted from demultiplexing section 451 and outputs the quantized LSP vector to synthesis filter 459 as a filter coefficient. Here, LSP vector dequantization apparatus 200 according to the present embodiment is used as LSP vector dequantization section 452. That is, the specific configuration and operation of LSP vector dequantization section 452 are the same as those of LSP vector dequantization apparatus 200. In this case, the encoded data inputted to LSP vector dequantization apparatus 200 corresponds to the quantized LSP code (L) inputted to LSP vector dequantization section 452. Furthermore, the quantized wide-band LSP vector outputted from LSP vector dequantization apparatus 200 corresponds to the quantized LSP vector outputted from LSP vector dequantization section 452. The narrow-band LSP vector inputted to LSP vector dequantization apparatus 200 is inputted, for example, from the outside of CELP decoding apparatus 450. When, for example, LSP vector dequantization apparatus 200 is applied to a scalable decoding apparatus (not shown) having a wide-band CELP decoding section (corresponding to CELP decoding apparatus 450) and a narrow-band CELP decoding section, the narrow-band LSP vector outputted from the narrow-band CELP decoding section is inputted to LSP vector dequantization apparatus 200.

Adaptive excitation codebook 453 extracts samples corresponding to one frame from the extraction position identified by the adaptive excitation lag code (A) inputted from demultiplexing section 451 from the buffer and outputs the extracted vector to multiplier 456 as an adaptive excitation vector.

Here, adaptive excitation codebook 453 updates contents of the buffer every time an excitation vector is inputted from adder 458.

Quantization gain generating section 454 decodes the quantized adaptive excitation gain and quantized fixed excitation gain indicated by the quantized excitation gain code (G) inputted from demultiplexing section 451, outputs the quantized adaptive excitation gain to multiplier 456 and outputs the quantized fixed excitation gain to multiplier 457.

Fixed excitation codebook 455 generates a fixed excitation vector indicated by the fixed excitation vector code (F) inputted from demultiplexing section 451 and outputs the fixed excitation vector to multiplier 457.

Multiplier 456 multiplies the adaptive excitation vector inputted from adaptive excitation codebook 453 by the quantized adaptive excitation gain inputted from quantization gain generating section 454 and outputs the multiplication result to adder 458.

Multiplier 457 multiplies the fixed excitation vector inputted from fixed excitation codebook 455 by the quantized fixed excitation gain inputted from quantization gain generating section 454 and outputs the multiplication result to adder 458.

Adder 458 adds up the adaptive excitation vector after the gain multiplication inputted from multiplier 456 and the fixed excitation vector after the gain multiplication inputted from multiplier 457, generates an excitation vector and outputs the generated excitation vector to synthesis filter 459 and adaptive excitation codebook 453. Here, the excitation vector inputted to adaptive excitation codebook 453 is stored in the buffer of adaptive excitation codebook 453.

Synthesis filter 459 performs synthesis processing using the excitation vector inputted from adder 458 and the filter coefficient decoded by LSP vector dequantization section 452 and outputs the generated synthesis signal to post-processing section 460.

Post-processing section 460 applies processing of improving subjective quality of speech such as formant emphasis and pitch emphasis, and processing of improving subjective quality of static noise to the synthesis signal inputted from synthesis filter 459 and outputs a speech signal or music signal obtained.

Thus, using the vector quantization apparatus/vector dequantization apparatus of the present embodiment, the CELP encoding apparatus/CELP decoding apparatus according to the present embodiment can improve vector quantization accuracy during encoding and thereby also improve speech quality during decoding.

A case has been described in the present embodiment where CELP decoding apparatus 450 decodes encoded data outputted from CELP encoding apparatus 400. However, the present invention is not limited to this, but it goes without saying that the CELP decoding apparatus 450 can receive and decode any encoded data as long as the data is in a format the CELP decoding apparatus can decode.

The embodiment of the present invention has been described so far.

The vector quantization apparatus, vector dequantization apparatus and methods thereof according to the present invention are not limited to the above embodiment, but can be implemented with various changes.

For example, although the above embodiment has described the vector quantization apparatus, vector dequantization apparatus and methods thereof targeted at a speech signal or music signal, the present invention is also applicable to other possible signals.

Furthermore, LSP may also be called "LSF (Line Spectral Frequency)" and LSP may be read as LSF. Furthermore, when ISP (Immittance Spectrum Pairs) is quantized as a spectral parameter instead of LSP, LSP may be read as ISP and the present embodiment may be used as an ISP quantization/dequantization apparatus. When ISF (Immittance Spectrum Frequency) is quantized as a spectral parameter instead of LSP, LSP may be read as ISF and the present embodiment may be used as an ISF quantization/dequantization apparatus.

Furthermore, the vector quantization apparatus and vector dequantization apparatus according to the present invention can be mounted on a communication terminal apparatus or base station apparatus in a mobile communication system that carries out transmission of speech, music or the like. Thus, the present invention can provide a communication terminal apparatus or base station apparatus having effects similar to those described above.

Moreover, although a case has been described with the embodiment above where the present invention is configured by hardware, the present invention may be implemented by software. For example, by writing algorithms of the vector quantization method and vector dequantization method according to the present invention in a programming language, storing the program in memory and causing the information processing section to execute the program, it is possible to realize functions similar to those of the vector quantization apparatus and vector dequantization apparatus according to the present invention.

Each function block employed in the description of each of the aforementioned embodiments may typically be implemented as an LSI constituted by an integrated circuit. These may be individual chips or partially or totally contained on a single chip.

"LSI" is adopted here but this may also be referred to as "IC," "system LSI," "super LSI," or "ultra LSI" depending on differing extents of integration.

Further, the method of circuit integration is not limited to LSI's, and implementation using dedicated circuitry or general purpose processors is also possible. After LSI manufacture, utilization of a programmable FPGA (Field Programmable Gate Array) or a reconfigurable processor where connections and settings of circuit cells within an LSI can be reconfigured is also possible.

Further, if integrated circuit technology comes out to replace LSI's as a result of the advancement of semiconductor technology or a derivative other technology, it is naturally also possible to carry out function block integration using this technology. Application of biotechnology is also possible.

The disclosure of Japanese Patent Application No. 2009-031651, filed on Feb. 13, 2009, including the specification, drawings and abstract, is incorporated herein by reference in its entirety.

INDUSTRIAL APPLICABILITY

The vector quantization apparatus, vector dequantization apparatus and methods thereof according to the present invention are applicable to speech encoding and speech decoding or the like.

The invention claimed is:

1. A vector quantization apparatus comprising:
 a first selector that selects a classification code vector indicating a type of characteristics having a correlation with a vector to be quantized from among a plurality of classification code vectors;
 a second selector that selects a first codebook corresponding to the selected classification code vector from among a plurality of first codebooks;
 a first quantizer, including a processor, that quantizes the vector to be quantized using a plurality of first code vectors making up the selected first codebook, to obtain a first code;
 a third selector that selects a first rotation matrix corresponding to the selected classification code vector from among a plurality of first rotation matrices; and
 a second quantizer that quantizes a first residual vector which is a difference between the first code vector indicated by the first code and the vector to be quantized using a plurality of second code vectors and the selected first rotation matrix, to obtain a second code.

2. The vector quantization apparatus according to claim 1, wherein the second quantizer performs matrix calculation using the selected first rotation matrix on the plurality of second code vectors and quantizes the first residual vector using the plurality of second code vectors after the matrix calculation.

3. The vector quantization apparatus according to claim 1, wherein the second quantizer performs matrix calculation using an inverse matrix of the selected first rotation matrix on the first residual vector and quantizes the first residual vector after the matrix calculation using the plurality of second code vectors.

4. The vector quantization apparatus according to claim 1, wherein:
 the third selector further selects a second rotation matrix corresponding to the selected classification code vector from among the plurality of second rotation matrices; and
 the vector quantization apparatus further comprises a third quantizer that uses a plurality of third code vectors and the selected second rotation matrix, quantizes a second residual vector which is a difference between the first residual vector indicated by the second code and the second code vector and obtains a third code.

5. A vector dequantization apparatus comprising:
 a receiver that receives a first code obtained by a vector quantization apparatus quantizing a vector to be quantized and a second code obtained by further quantizing a quantization error of the quantization;
 a first selector that selects a classification code vector indicating a type of characteristics having a correlation with the vector to be quantized from among a plurality of classification code vectors;
 a second selector that selects a first codebook corresponding to the selected classification code vector from among a plurality of first codebooks;
 a first dequantizer, including a processor, that designates a first code vector corresponding to the first code from among a plurality of first code vectors making up the selected first codebook;
 a third selector that selects a rotation matrix corresponding to the selected classification code vector from among a plurality of rotation matrices; and
 a second dequantizer that designates a second code vector corresponding to the second code from among a plurality of second code vectors and obtains a quantization vector using the designated second code vector, the selected rotation matrix and the designated first code vector.

6. A vector quantization method performed by a processor, the vector quantization method comprising:
 selecting a classification code vector indicating a type of characteristics having a correlation with a vector to be quantized from among a plurality of classification code vectors;

selecting a first codebook corresponding to the selected classification code vector from among a plurality of first codebooks;

quantizing the vector to be quantized using a plurality of st code vectors making up the selected first codebook, to obtain a first code;

selecting a rotation matrix corresponding to the selected classification code vector from among a plurality of rotation matrices; and quantizing a first residual vector which is a difference between the first code vector indicated by the first code and the vector to be quantized using a plurality of second code vectors and the selected rotation matrix, to obtain a second code.

7. A vector dequantization method performed by a processor, the vector dequantization method comprising:

receiving a first code obtained by a vector quantization apparatus quantizing a vector to he quantized and a second code obtained by further quantizing a quantization error of the quantization;

selecting a classification code vector indicating a type of characteristics having a correlation with the vector to be quantized from among a plurality of classification code vectors;

selecting a first codebook corresponding to the selected classification code vector from among a plurality of first codebooks;

designating a first code vector corresponding to the first code from among a plurality of first code vectors making up the selected first codebook;

selecting a rotation matrix corresponding to the selected classification code vector from among a plurality of rotation matrices; and designating a second code vector corresponding to the second code from among a plurality of second code vectors and obtaining a quantization vector using the designated second code vector, the selected rotation matrix and the designated first code vector.

* * * * *